(12) United States Patent
Yan et al.

(10) Patent No.: US 11,604,990 B2
(45) Date of Patent: Mar. 14, 2023

(54) MULTI-TASK LEARNING FRAMEWORK FOR MULTI-CONTEXT MACHINE LEARNING

(71) Applicant: Microsoft Technology Licensing, LLC, Redmond, WA (US)

(72) Inventors: Xiao Yan, Sunnyvale, CA (US); Wenjia Ma, Sunnyvale, CA (US); Jaewon Yang, Sunnyvale, CA (US); Jacob Bollinger, San Francisco, CA (US); Qi He, San Jose, CA (US); Lin Zhu, Santa Clara, CA (US); How Jing, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 378 days.

(21) Appl. No.: 16/902,587

(22) Filed: Jun. 16, 2020

(65) Prior Publication Data

US 2021/0390390 A1 Dec. 16, 2021

(51) Int. Cl.
| | | |
|---|---|---|
| *G06N 3/08* | (2006.01) | |
| *G06F 9/48* | (2006.01) | |
| *H04L 67/50* | (2022.01) | |
| *G06F 30/27* | (2020.01) | |
| *G06N 3/02* | (2006.01) | |

(52) U.S. Cl.
CPC ............. *G06N 3/08* (2013.01); *G06F 9/4881* (2013.01); *G06F 30/27* (2020.01); *G06N 3/02* (2013.01); *H04L 67/535* (2022.05)

(58) Field of Classification Search
CPC ............ G06N 3/08; G06N 3/02; G06N 3/084; G06N 3/0454; G06N 3/0481; G06F 9/4881; G06F 30/27; H04L 67/535; H04L 67/306
See application file for complete search history.

(56) References Cited

U.S. PATENT DOCUMENTS

| | | | |
|---|---|---|---|
| 2002/0083025 A1* | 6/2002 | Robarts | G06F 21/6245 706/12 |
| 2013/0031489 A1* | 1/2013 | Gubin | G06Q 10/10 715/753 |
| 2018/0189603 A1* | 7/2018 | Zhang | G06Q 30/0269 |
| 2019/0130281 A1* | 5/2019 | Yang | G06N 5/02 |
| 2019/0236106 A1* | 8/2019 | Zhang | G06Q 30/02 |

* cited by examiner

*Primary Examiner* — Farley Abad
(74) *Attorney, Agent, or Firm* — Schwegman Lundberg & Woessner, P.A.

(57) ABSTRACT

In an example embodiment, a framework to infer a user's value for a particular attribute based upon a multi-task machine learning process with uncertainty weighting that incorporates signals from multiple contexts is provided. In an example embodiment, the framework aims to measure a level of a user attribute under a certain context. Rather than attempting to devise a universal, one-size-fits-all value for the attribute, the framework acknowledges that the user's value for that attribute can vary depending on context and factors in the context under which the user's attribute levels are measured. Multiple contexts are defined depending on different situations where users and entities such as companies and organizations need to evaluate user attribute levels. Signals for attribute levels are then collected for each context. Machine learning models are utilized to estimate attribute values for different contexts. Multi-task deep learning is used to level attributes from different contexts.

20 Claims, 7 Drawing Sheets

MULTI-TASK LEARNING FRAMEWORK FOR MULTI-CONTEXT MACHINE LEARNING

TECHNICAL FIELD

The present disclosure generally relates to technical problems encountered in machine learning. More specifically, the present disclosure relates to a multi-task learning framework for multi-context machine learning.

BACKGROUND

The rise of the Internet has occasioned two disparate yet related phenomena: the increase in the presence of online networks, with their corresponding user profiles visible to large numbers of people, and the increase in the use of these online networks to provide content. Online networks generally provide users with the ability to create a user profile and then to connect their user profile to other user profiles (a process commonly referred to as "linking" or "friending"). Some online networks are more geared towards career advancement of its users than on more personal/social aspects. These career-focused online networks may allow a user profile to indicate various attributes (such as skills) that the corresponding user has. The values for these attributes, however, can be collected under different circumstances within the same online network. These different circumstances may reflect different contexts, and the meaning of these values can actually be different based on the context in which they were collected. For example, a user indicating that he or she has a particular skill level at a particular skill may mean something different if this information was collected in the context of a portion of the online network devoted to providing a search experience for users to search for open jobs than if this information was collected in the context of a portion of the online network devoted to recommending additional courses for the user to take.

Additionally, the values for the attributes may be used in different context, such as determining whether to recommend a particular job associated with a job listing to the user, determining whether to recommend the user as a candidate for a particular job associated with a job listing, recommending additional educational materials or courses for the user, etc. Each of these goals can be considered a different context for use of the values for the attributes.

For example, a professor in machine learning may have deep theoretical knowledge, but may lack the practical skill for implementing a large-scale machine learning recommendation system, unlike experienced machine-learning practitioners. Thus, the value of the professor's knowledge of machine learning may be different in the context of recommending articles the professor may be interested in viewing than in the context of recommending a job opening as a programmer. In other words, the level of a value of an attribute may utilize a different measure depending on the context. Ground truth data is training data that is "known" to be true, namely there is some level of confidence by whomever is utilizing the training data that is accurate. The confidence in the truth of particular data can vary depending on the context in which it was collected and the goal of its use. Ground-truth data can at scale can be difficult to obtain in online networks as when easily verifiable data exists in such networks it is usually only very specific types of data within the online network for which the confidence exists. A user's stated educational degree, for example, may be easily verifiable, but a user's skill in a particular field may not be, and as such it is difficult to verify more than small percentage of the available training data when it comes to these types of attributes. Even if perfect ground-truth data was easily obtained, however, it could have different semantic meanings depending upon the context in which the data are collected and also depending upon the context in which they are used. In the professor example, even if, for example, a standardized test were given to the professor that quantified his or her level of skill in machine learning, that standardized test may only really be verifying the professor's theoretical knowledge, not practical ability.

Additionally, users tend to overestimate their own abilities in some contexts, and underestimate them in others, and thus relying on, or at least solely on, a user's own self-assessment of their expertise in particular attributes may cause the attribute levels to be biased based on the context in which it was collected.

BRIEF DESCRIPTION OF THE DRAWINGS

Some embodiments of the technology are illustrated, by way of example and not limitation, in the figures of the accompanying drawings.

DETAILED DESCRIPTION

Overview

The present disclosure describes, among other things, methods, systems, and computer program products that individually provide various functionality. In the following description, for purposes of explanation, numerous specific details are set forth in order to provide a thorough understanding of the various aspects of different embodiments of the present disclosure. It will be evident, however, to one skilled in the art, that the present disclosure may be practiced without all of the specific details.

In an example embodiment, a framework to infer a user's value for a particular attribute based upon a multi-task machine learning process with uncertainty weighting that incorporates signals from multiple contexts is provided.

Existing machine learning methods have significant technical limitations when applied to the problem of estimating values of attributes of users when the values are collected and/or utilized in different contexts of an online network. Unsupervised methods, such as PageRank, heavily rely on input graphs so that if input graphs are noisy, the output estimates become less reliable. To address this, researchers have proposed developing a supervised method with user feedback, but these methods focus on a single context. For example, a machine learned model may be focused on estimating skill expertise levels of users who give presentations to famous conferences. What is lacking is the ability to estimate attribute levels under different contexts.

In an example embodiment, the framework aims to measure a level of a user attribute under a certain context. Rather than attempting to devise a universal, one-size-fits-all value for the attribute, the framework acknowledges that the user's value for that attribute can vary depending on context and factors in the context under which the user's attribute levels are measured. Multiple contexts are defined depending on different situations where users and entities such as companies and organizations need to evaluate user attribute levels. Signals for attribute levels are then collected for each context. Machine learning models are utilized to estimate attribute values for different contexts. In particular, multi-task deep learning is used to level attributes from different contexts in a holistic way.

In an example embodiment, eight different contexts are utilized, although one of ordinary skill in the art will recognize that any number of different contexts may be utilized. To learn holistically from the eight different contexts (and thus eight different data sets of training data), multi-task learning is applied. Multi-task learning uses common layers and ensures that the estimates are relatively consistent for similar contexts, while task-specific layers allow the model to capture the task-specific features and provide fine-tuned scores per context. Because the multi-task model has shared parameters across different tasks, the total number of parameters in the proposed model is a fraction of what multiple single-task models would produce, even if the results of these single-task models were combined to perform a similar estimate of skill expertise levels. Furthermore, the above can be implemented in a single pipeline, meaning that the varying values to apply to a given attribute in a given context can all be computed in a single process, rather than requiring a separate process for each context in which the attribute value will be utilized, which requires less maintenance cost engineering-wise than other solutions, as other solutions require separate processes that will all need to be updated each time a modification to another of the processes is made.

Description

The disclosed embodiments provide a method, apparatus, and system for using machine learning to infer attribute levels for users of an online network. Specifically, a user's level of a particular attribute is inferred based upon a multi-task machine learning process with uncertainty weighting that incorporates signals from multiple contexts.

As described briefly above, one specific example of an attribute on which the disclosed techniques can be applied is in skill expertise levels. A skill expertise level is a value assigned to a level of expertise a user has in a particular skill. The expertise level may typically be quantified on a set scale, for example a value between 0 and 10 with 0 meaning the user has no expertise at all in the skill and 10 meaning the user has the most possible expertise in the skill. While the present disclosure may explain certain concepts in terms of the skill expertise level embodiment, one of ordinary skill in the art will recognize that the claims shall not be interpreted as being limited to this embodiment unless explicitly recited.

Figure 1:
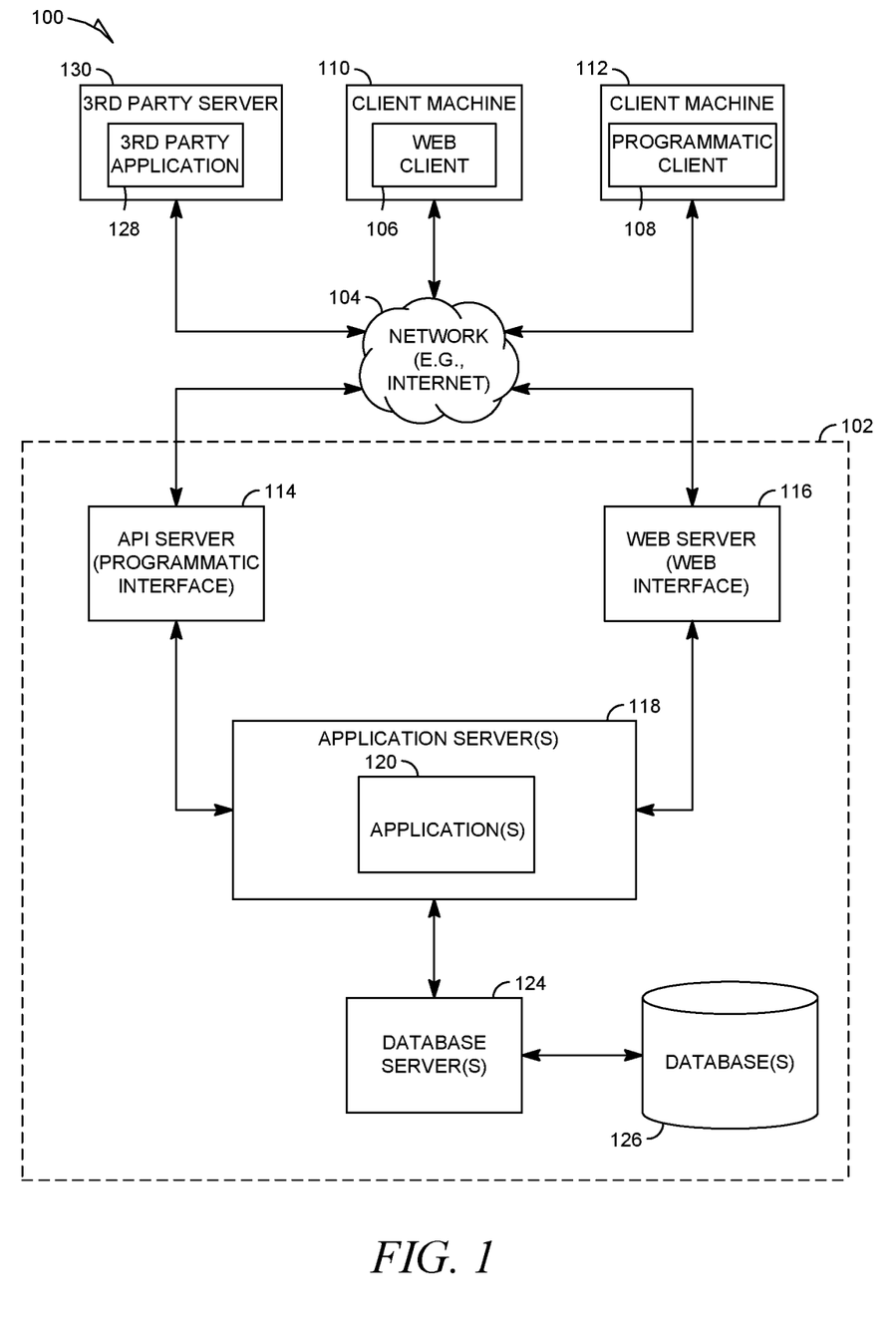
FIG. 1 is a block diagram illustrating a client-server system, in accordance with an example embodiment.

FIG. 1 is a block diagram illustrating a client-server system 100, in accordance with an example embodiment. A networked system 102 provides server-side functionality via a network 104 (e.g., the Internet or a wide area network (WAN)) to one or more clients. FIG. 1 illustrates, for example, a web client 106 (e.g., a browser) and a programmatic client 108 executing on respective client machines 110 and 112.

An application program interface (API) server 114 and a web server 116 are coupled to, and provide programmatic and web interfaces respectively to, one or more application servers 118. The application server(s) 118 host one or more applications 120. The application server(s) 118 are, in turn, shown to be coupled to one or more database servers 124 that facilitate access to one or more databases 126. While the application(s) 120 are shown in FIG. 1 to form part of the networked system 102, it will be appreciated that, in alternative embodiments, the application(s) 120 may form part of a service that is separate and distinct from the networked system 102.

Further, while the client-server system 100 shown in FIG. 1 employs a client-server architecture, the present disclosure is, of course, not limited to such an architecture, and could equally well find application in a distributed, or peer-to-peer, architecture system, for example. The various applications 120 could also be implemented as standalone software programs, which do not necessarily have networking capabilities.

The web client 106 accesses the various applications 120 via the web interface supported by the web server 116. Similarly, the programmatic client 108 accesses the various services and functions provided by the application(s) 120 via the programmatic interface provided by the API server 114.

FIG. 1 also illustrates a third-party application 128, executing on a third-party server 130, as having programmatic access to the networked system 102 via the programmatic interface provided by the API server 114. For example, the third-party application 128 may, utilizing information retrieved from the networked system 102, support one or more features or functions on a website hosted by a third party. The third-party website may, for example, provide one or more functions that are supported by the relevant applications 120 of the networked system 102.

In some embodiments, any website referred to herein may comprise online content that may be rendered on a variety of devices including, but not limited to, a desktop personal computer (PC), a laptop, and a mobile device (e.g., a tablet computer, smartphone, etc.). In this respect, any of these devices may be employed by a user to use the features of the present disclosure. In some embodiments, a user can use a mobile app on a mobile device (any of the machines 110, 112 and the third-party server 130 may be a mobile device) to access and browse online content, such as any of the online content disclosed herein. A mobile server (e.g., API server 114) may communicate with the mobile app and the application server(s) 118 in order to make the features of the present disclosure available on the mobile device.

Figure 2:
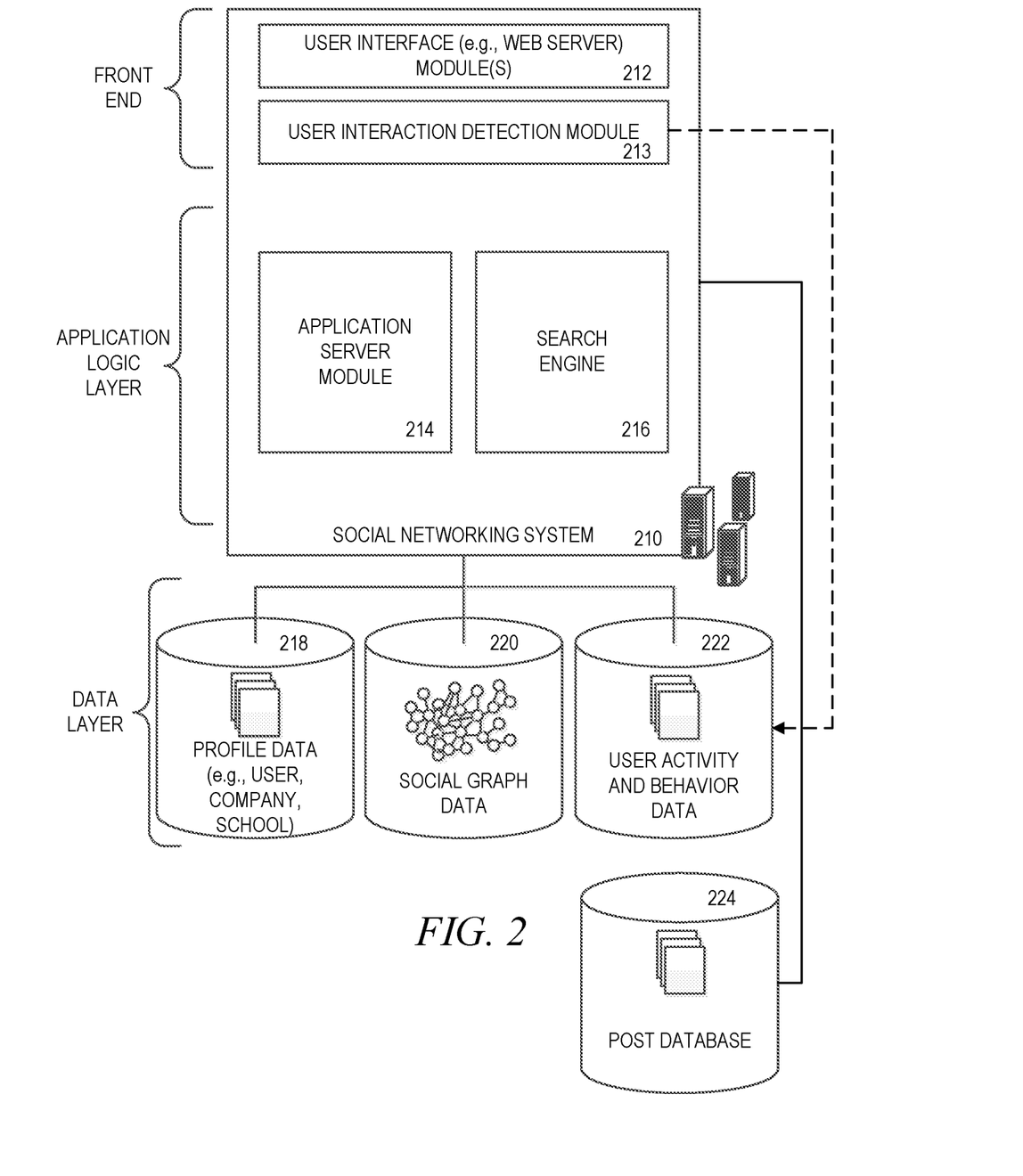
FIG. 2 is a block diagram showing the functional components of an online network, including a data processing module referred to herein as a search engine, for use in generating and providing search results for a search query, consistent with some embodiments of the present disclosure.

In some embodiments, the networked system 102 may comprise functional components of an online network. FIG. 2 is a block diagram showing the functional components of an online network, including a data processing module referred to herein as a search engine 216, for use in generating and providing search results for a search query, consistent with some embodiments of the present disclosure. In some embodiments, the search engine 216 may reside on the application server(s) 118 in FIG. 1. However, it is contemplated that other configurations are also within the scope of the present disclosure.

As shown in FIG. 2, a front end may comprise a user interface module (e.g., a web server 116) 212, which receives requests from various client computing devices and communicates appropriate responses to the requesting client devices. For example, the user interface module(s) 212 may receive requests in the form of Hypertext Transfer Protocol (HTTP) requests or other web-based API requests. In addition, a user interaction detection module 213 may be provided to detect various interactions that users have with different applications 120, services, and content presented. As shown in FIG. 2, upon detecting a particular interaction, the user interaction detection module 213 logs the interaction, including the type of interaction and any metadata relating to the interaction, in a user activity and behavior database 222.

An application logic layer may include one or more various application server modules 214, which, in conjunction with the user interface module(s) 212, generate various user interfaces (e.g., web pages) with data retrieved from various data sources in a data layer. In some embodiments, individual application server modules 214 are used to implement the functionality associated with various applications 120 and/or services provided by the online network.

As shown in FIG. 2, the data layer may include several databases 126, such as a profile database 218 for storing profile data, including both user profile data and profile data for various organizations (e.g., companies, schools, etc.). Consistent with some embodiments, when a person initially registers to become a user of the online network, the person will be prompted to provide some personal information, such as his or her name, age (e.g., birthdate), gender, interests, contact information, home town, address, spouse's and/or family members' names, educational background (e.g., schools, majors, matriculation and/or graduation dates, etc.), employment history, skills, professional organizations, and so on. This information is stored, for example, in the profile database 218. Similarly, when a representative of an organization initially registers the organization with the online network, the representative may be prompted to provide certain information about the organization. This information may be stored, for example, in the profile database 218, or another database (not shown). In some embodiments, the profile data may be processed (e.g., in the background or offline) to generate various derived profile data. For example, if a user has provided information about various job titles that the user has held with the same organization or different organizations, and for how long, this information can be used to infer or derive a user profile attribute indicating the user's overall seniority level or seniority level within a particular organization. In some embodiments, importing or otherwise accessing data from one or more externally hosted data sources may enrich profile data for both users and organizations. For instance, with organizations in particular, financial data may be imported from one or more external data sources and made part of an organization's profile. This importation of organization data and enrichment of the data will be described in more detail later in this document.

Once registered, a user may invite other users, or be invited by other users, to connect via the online network. A "connection" may constitute a bilateral agreement by the users, such that both users acknowledge the establishment of the connection. Similarly, in some embodiments, a user may elect to "follow" another user. In contrast to establishing a connection, the concept of "following" another user typically is a unilateral operation and, at least in some embodiments, does not require acknowledgement or approval by the user that is being followed. When one user follows another, the user who is following may receive status updates (e.g., in an activity or content stream) or other messages published by the user being followed, relating to various activities undertaken by the user being followed. Similarly, when a user follows an organization, the user becomes eligible to receive messages or status updates published on behalf of the organization. For instance, messages or status updates published on behalf of an organization that a user is following will appear in the user's personalized data feed, commonly referred to as an activity stream or content stream. In any case, the various associations and relationships that the users establish with other users, or with other entities and objects, are stored and maintained within a social graph in a social graph database 220.

As users interact with the various applications 120, services, and content made available via the online network, the users' interactions and behavior (e.g., content viewed, links or buttons selected, messages responded to, etc.) may be tracked, and information concerning the users' activities and behavior may be logged or stored, for example, as indicated in FIG. 2, by the user activity and behavior database 222. This logged activity information may then be used by the search engine 216 to determine search results for a search query.

In some embodiments, the databases 218, 220, and 222 may be incorporated into the database(s) 126 in FIG. 1. However, other configurations are also within the scope of the present disclosure.

Although not shown, in some embodiments, the social networking system 210 provides an API module via which applications 120 and services can access various data and services provided or maintained by the online network. For example, using an API, an application may be able to request and/or receive one or more recommendations. Such applications 120 may be browser-based applications 120 or may be operating system-specific. In particular, some applications 120 may reside and execute (at least partially) on one or more mobile devices (e.g., phone or tablet computing devices) with a mobile operating system. Furthermore, while in many cases the applications 120 or services that leverage the API may be applications 120 and services that are developed and maintained by the entity operating the online network, nothing other than data privacy concerns prevents the API from being provided to the public or to certain third parties under special arrangements, thereby making the navigation recommendations available to third-party applications 128 and services.

Although features of the present disclosure are referred to herein as being used or presented in the context of a web page, it is contemplated that any user interface view (e.g., a user interface on a mobile device or on desktop software) is within the scope of the present disclosure.

In an example embodiment, when user profiles are indexed, forward search indexes are created and stored. The search engine 216 facilitates the indexing and searching for content within the online network, such as the indexing and searching for data or information contained in the data layer, such as profile data (stored, e.g., in the profile database 218), social graph data (stored, e.g., in the social graph database 220), and user activity and behavior data (stored, e.g., in the user activity and behavior database 222). The search engine 216 may collect, parse, and/or store data in an index or other similar structure to facilitate the identification and retrieval of information in response to received queries for information. This may include, but is not limited to, forward search indexes, inverted indexes, N-gram indexes, and so on.

Figure 3:
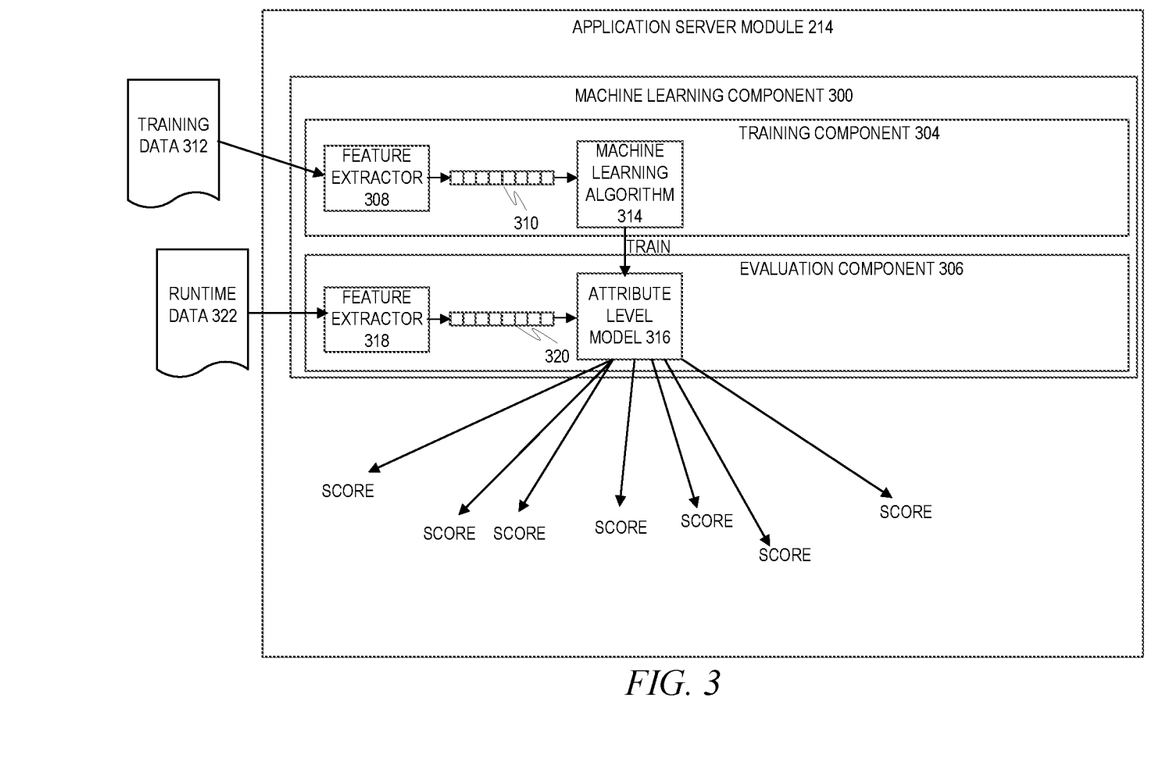
FIG. 3 is a block diagram illustrating an application server module of FIG. 2 in more detail, in accordance with an example embodiment.

FIG. 3 is a block diagram illustrating application server module 214 of FIG. 2 in more detail, in accordance with an example embodiment. While in many embodiments the application server module 214 will contain many subcomponents used to perform various different actions within the social networking system 210, in FIG. 3 only those components that are relevant to the present disclosure are depicted.

A machine learning component 300 may be used to predict, at runtime, a level of a particular attribute (such as expertise of a skill) for a particular user. The machine learning component 300 may include a training component 304 and an evaluation component 306. The training component 304 uses feature extractor 308 to extract one or more features 310 from training data 312. The training data 312 may include, for example, user profiles (which may include attribute levels provided from the user himself or herself), corresponding user activity information (e.g., interactions the users made with the online network), and information about the corresponding users provided by other users (such as feedback information). The one or more features 310 may then be fed to a machine learning algorithm 314 that trains an attribute level model 316. The attribute level model 316 may be specifically trained to output a score for an attribute of the user for each of a plurality of different contexts (i.e., a potentially different score for the same user/attribute for each of the different contexts). More particularly, the information about the users from other users, such as feedback information, may be considered "labels" for the rest of the training data 312. In machine learning, a label is a value in the training data for a variable that is being predicted by the machine learned model. The attribute level model 316 may be a global model, meaning that it is a single model for all users and all attributes.

It should be noted that in an example embodiment the attribute has an identical label in each of the plurality of contexts. Thus, for example, the skill "Java" will be called "Java" whether it is being described in the context of a user self-assessment form or being suggested for rating by a different user. In some example embodiments, however, the attributes may have different labels in different contexts as long as there is some way to link an attribute in one context to what should be considered to be that same attribute in another context, such as by assigning a numerical attribute identification that is shared across the contexts.

At runtime, feature extractor 318 may receive an indication of a particular input user and a particular input attribute to examine and extract one or more features 320 from runtime data 322. The runtime data 322 may include the input user's profile and activity information. The one or more features 320, which then correspond just to the input user and the input attribute being considered, are passed to the attribute level model 316, which outputs a score for the attribute and user combination, for each of a plurality of different contexts. If, for example, there are eight different contexts, then there are potentially eight different scores output by the attribute level model 316. These scores may then be themselves utilized in various different contexts, which may or may not align with the contexts for which the scores have been generated.

In an example embodiment, the online network may be an online network with multiple channels. Each channel is a different form of disseminating information to users and receiving information from users. Each channel may have one or more contexts within it, representing different areas of a graphical user interface. General examples of channels include job searches, feeds, user searches, etc. In an example embodiment, for user skill expertise levels, three specific channels are used to produce eight different contexts. Each context has a corresponding user action that is binary in nature that can be used to help predict user attribute levels. Such feedback can be used in the training of the machine learned model. Training data can thus be collected from multiple contexts and aggregated into a single training data set. This allows the machine learning algorithm to learn from multiple scenarios. Specifically, the training data set is fed into a multi-task learning framework. In this model, each context will be treated as a single task. The shared part(s) of the contexts is/are used to capture the similarities of the contexts, while the specific part for each context in the model is used to capture the specificity of the contexts. In the loss function (the training objective of the machine learning algorithm), adjustable weights, which can be set either by a human with domain knowledge or through an automated process, can be used to balance the relative importance of the contexts.

Examples of channels include a user self-assessment channel (where a graphical user interface is provided for a user to enter his or her own values for one or more attributes), an external event channel (where a graphical user interface is provided for the user or other users to indicate events that have occurred to or related to the user, such as a promotion, job change, location changes, etc.), and an external feedback channel (where a graphical user interface is provided for other users to provide feedback about the first user, such as through endorsements (which are publicly viewable endorsements) or anonymous assessments (which are not publicly viewable).

For the user-self assessment channel, in one example embodiment, when an applicant applies for a job, the online network may present the user with assessment questions asking for the length of experience for a given skill. For example, one question may be "do you have given years of experience in Java?." An example of a context in this channel is a user-self assessment context (whose binary signal is whether the user answered yes to a question relating to whether the user's skill level met a certain threshold).

For the eternal event channel, in one example embodiment job-related signals are obtained. In these signals the focus is on who gets hired based on a particular skill. Hiring is a long process that involves many different decision makers. An applicant typically will go through recruiter screening, hiring manager screening, and then pass an interview. Thus, signals may be collected at different stages.

A confirmed hire signal measures who finally gets hired for a job associated with a particular job listing. The events of the user's title change may be aligned with the user's job application. From the pairs of users/job applications extracted, common skills on the user's profile and the job requirements of the job listing may be identified.

The confirmed hire signal's limitation is that, while there are many applicants who would qualify for a given job listing, only those who took the job are examined. To alleviate this limitation, two more job-related signals may be collected from intermediate feedback. Specifically, candidate management collects signals from hiring managers. If the hiring manager sends out an interview to an application, the applicant is treated as qualified for the job. Additionally, recruiter search confirmation provides signals from the feedback of recruiters. If the recruiter searches for a certain skill and contacts a particular user, it is assumed the member is reputable for the skill.

Example contexts in this channel include candidate management (whose binary signal is whether an interview request was sent), confirmed hire (whose binary signal is whether a title change occurred), and recruiter search confirmation (whose binary signal is whether a recruiter contacted the user).

For the external feedback channel, in one example embodiment quality endorsement signals may be gathered, where any other user whose profile is linked to another user's profile is given the chance to show recognition of the skill expertise of the other user. So if Joe's profile is linked to Mary's profile, then Joe may be presented with a graphical user interface that allows Joe to endorse one or more of Mary's skills. One issue that arises from using this endorsement as a signal in the training of the machine learned model is that often these endorsements can be used as a social gesture rather than a fair evaluation of the other user's skill expertise (e.g., Joe may say to Mary that he will endorse one of her skills if she will do the same to him). To remove such noise, a separate model may be used to filter higher quality endorsements based on the endorser's skill level. For example, endorsements from endorsers who have skill expertise levels below a certain threshold in a particular skill are discarded from consideration if the endorsement is being made for that particular skill.

Another example embodiment for the external feedback channel is the gathering of skill valuation signals. Skill valuation involves the online network soliciting anonymous feedback of another user's skill expertise from the user's connections. Since the feedback is anonymous, it ensures objectivity more than non-anonymous endorsements.

Example contexts in this channel include quality endorsement (whose binary signal is whether an endorsement was accepted), an indication of a person a user would recommend for a particular skill (whose binary signal is whether a viewer clicked on the user as being the most qualified person in the skill), endorsement follow-up (whose binary signal is whether the endorsement was confirmed, which is typically performed anonymously after the endorsement was accepted), and an indication that a viewer indicates a particular skill as being a user's top skill (whose binary signal is whether the viewer clicked on the skill as being a top skill for the user).

As stated earlier, the meaning of an expertise level in a particular skill is unique under each context. On the other hand, similar contexts should give similar estimations of a user's skill expertise. For example, if a user gets a job offer in candidate management for a given skill, then likely the user will be contacted by a recruiter for similar positions requiring the same skill. In an example embodiment, context-specific skill reputation scores are generated while capturing common features between similar contexts by applying multi-task learning to simultaneously learn from multiple contexts.

Figure 4:
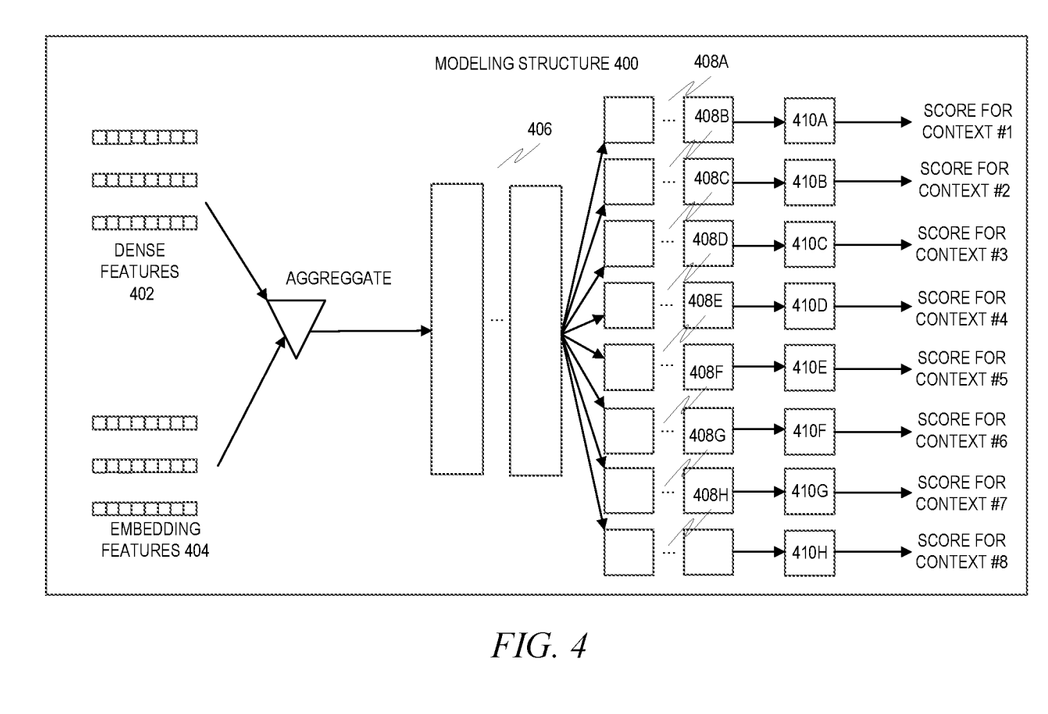
FIG. 4 is a block diagram illustrating a modeling structure contained in the machine learning algorithm of FIG. 3, in accordance with an example embodiment.

FIG. 4 is a block diagram illustrating a modeling structure 400 contained in the machine learning algorithm 314 of FIG. 3, in accordance with an example embodiment. In an example embodiment, the modeling structure 400 may be a convolutional neural network. Dense features 402 and embedding features 404 are aggregated and passed through K shared layers 406. The K shared layers 406 attempt to learn weights for each of a plurality of different feature types based on the aggregated training data. The K shared layers operate for all the contexts together. Following that are eight different sets of context-specific layers 408A-408H, one for each context. Of course, the precise number of different sets of context-specific layers 408A-408H will depend on the number of contexts. It just so happens that in this example there are eight.

At each layer, layer normalization is applied before rectifier linear unit activation. Residual connections are used between every two layers. A residual connection allows gradients to flow through a network directly, without passing through non-linear activation functions. Finally, a sigmoid layer 410A-410H is attached to each context to produce the final score r∈[0, 1] per context. A sigmoid layer is a layer that applies a sigmoid function to its input. A sigmoid function is a bounded, differentiable, real function that is defined for all real input values and has a non-negative derivative at each point. Shared layers 406 allow different contexts to share statistical power while the context-specific layers 408A-408H fine tune the representation for making the final predictions.

In an example embodiment, the multi-task model is a deep convolutional neural network. In contrast to existing learning methods, which employ either unsupervised or single-task supervised objectives, the multi-task model learns the representations using multi-task objectives.

The learning process may be cast as multiple binary classification problems where a context c is associated with a cross entropy loss:

$$L_c = - \sum_{\langle m,s \rangle \in D_c} (y_c^{ms} * \log(r_c^{ms}) + (1 - y_c^{ms}) * \log(1 - r_c^{ms}))$$

Where $D_c$ is the labeled dataset collected under context c (through an impression/action log) and $y_c^{ms}, r_c^{ms}$ are the ground-truth action and model's prediction for the <m, s> pair respectively, where m is the user and s is the skill.

One of two different heuristics may be used for combining context-specific losses. The first is simple sum. This is to treat each task (context) as equally important as follows:

$$L^* = \sum_c L_c$$

The second is weighted sum. In an example embodiment, weighted sum is the heuristic used due to its better performance in many circumstances. Specifically, since the overall performance of the multi-task model is heavily dependent on the weights between task losses, a weighted sum loss can be used and the weights of each task can be automatically learned. The output of each task c is modeled as the scaled version of the softmax:

$$p(y_c \mid f(x; W_c), \sigma_c) = Softmax\left(\frac{1}{\sigma_c^2} f(x; W_c)\right)$$

$W_c$ represents the context-specific parameters, meaning the context parameters that are unique to this context, $\sigma_c$ is a positive scalar and can be interpreted as the temperature of the Boltzmann distribution that determines the variance of the resulting distribution (the confidence of the score prediction). A Boltzmann distribution is a distribution borrowed from chemistry defining a probability that a system will be in a certain state as a function of that state's energy and the temperature of the system. The Boltzmann distribution can be applied to the present technical problem by substituting the context-specific parameters for the temperature of the system. By assuming the independence of task distributions and maximizing the joint softmax likelihood of all tasks, the job loss L* becomes:

$$L^* = -\log\left(\prod_c p(y_c | f(x; W_c), \sigma_c)\right)$$
$$= -\sum_c \log(p(y_c | f(x; W_c), \sigma_c))$$
$$\approx \sum_c \left(\frac{1}{2\sigma_c^2} L_c + \log \sigma_c\right)$$

where the new context-dependent loss now is $$L'_c = \frac{1}{2\sigma_c^2} L_c + \log \sigma_c$$

At each training step, one context c is randomly chosen, $L_c$ (or $L_c'$ in the case of weighted sum) is calculated, and the gradient is backpropagated to update the model's parameters.

Both dense features and embedding features are used in the model so as to maximize the advantage of combining human domain knowledge with regularities automatically learned by the machine. Human domain knowledge is knowledge provided by humans as to the meanings of different contexts, and this domain knowledge is typically provided in the form of dense features, in contrast to embedding features which are normally learned through machine learning. Dense features may be categorized into three groups: user features, skill features, and user-skill interaction features. User features include measuring the total duration of the user's working experience. This is interpreted as tenure, which is highly correlated to skill expertise. Skill features include calculating the frequency that a skill appears in a user profile, as well as the skill entropy, which is defined as follows:

$$p_{sd} = \frac{n(s, d)}{\sum_{d'} n(s, d')}$$
$$\text{Entropy}(s) = -\sum_d p_{sd} \log(p_{sd})$$

Where d is the industry associated with each user m, and "n (s, d)" counts the number of users in industry d having skill s. The more generic a skill is across industries, the higher the skill entropy.

User-skill interaction features include a number of different features, including a user's skill connection strength, a user's skill mentions, and a user's pointwise mutual information (PMI). The user's skill connection strength may be estimated by defining a skill connection as the connected user that has the target skill. To estimate the connection strength, a model that outputs a score that represents how strongly two users are connected is used. This score may be used as a weight and the weighted sum of skill connections may be calculated.

The user's skill mentions is defined as the number of occurrences of the skill in the user's profiles. Mentions of skills in the user profile may be tagged using a natural language processing algorithm, such as Bidirectional Encoder Representations (BERT).

The user's PMI is a measure of association among the user's skills Specifically, PMI is calculated between the target skill and other skills the user possesses by quantifying the discrepancy between the probability of their coincidence given their joint distribution and their individual distributions, assuming independence As to embedding features, a user's profile is rich with entities, such as titles, skills, schools, and companies, that represent the user. The information contained in the entities is used to generate entity embeddings with the skip-gram loss:

$$L = \sum_{u \in V} \sum_{i \in P} \left(\log(\sigma(W_i \cdot W_u^T)) + \sum_{j \in N} \log(\sigma(-W_j \cdot W_u^T))\right)$$

Where V is the entity vocabulary, W is the embedding metric, P is the entities co-occurring with the target entity u on the user profile, and N represents the sampled unrelated entities. User embeddings and skill embeddings are used as features. User embeddings are generated by pooling the entity embeddings of the user.

As an online network expands, contexts related to users' skill expertise will grow rapidly. When a new context is launched, the feature pairs collected are limited at the beginning. In an example embodiment, the multi-task model is used on a new context, with little training data. Specifically, a scenario is simulated by randomly choosing a context to neglect when training the multi-task model and adding back a limited portion of the data for the chosen context. There are two approaches that can be used.

The first approach is to retrain the multi-task model, adding different portions of the additional context. The information from the other contexts essentially gets transferred to the task-specific model for the additional context.

The second approach is to use previous contextual scores as features to train a classifier to fit the new context. This greatly reduces computational resources due to the small amount of training data for the new context (retraining an entire model just due to the small increase of training data may be wasteful). In an example embodiment, the classifier is a logistic regression classifier.

Figure 5:
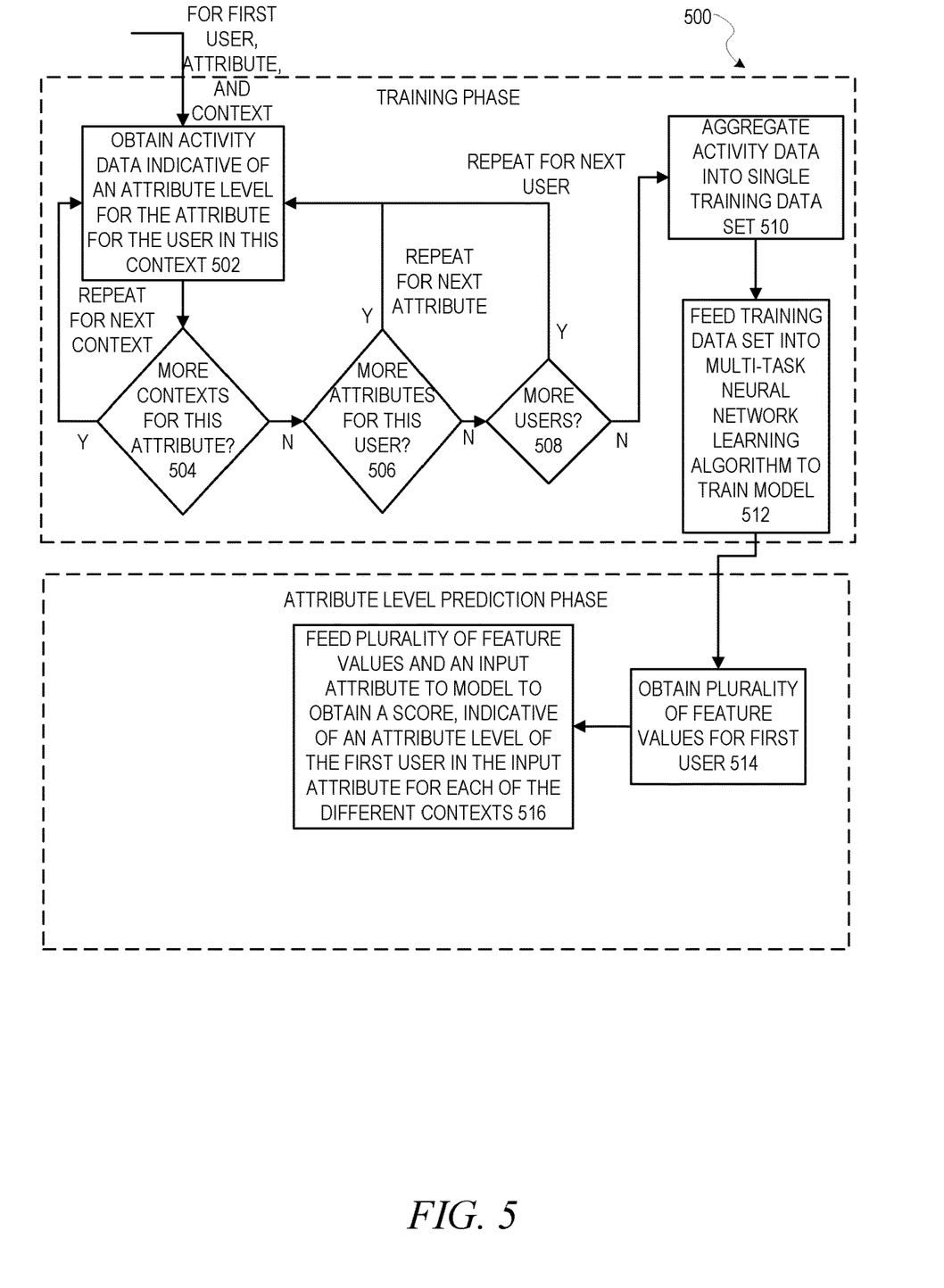
FIG. 5 is a flow diagram illustrating a method for calculating a predicted attribute level for a user for a skill in each of a plurality of different contexts, in accordance with an example embodiment.

FIG. 5 is a flow diagram illustrating a method 500 for calculating a predicted attribute level for a user for an attribute in each of a plurality of different contexts, in accordance with an example embodiment. A loop is begun that repeats for every context, attribute, and user in a training set. At operation 502, activity data indicative of a level in the attribute of the user in the context is obtained. At operation 504, it is determined if there are any more contexts for this attribute for this user in the training set. If so, then the method 500 loops back to operation 502 for the next context. If not, then at operation 506 it is determined if there are any more attributes for this user in the training set. If so, then the method 500 loops back to operation 504 for the next attribute. If not, then at operation 508 it is determined if there are any more users in the training set. If so, then the method 500 loops back to operation 502 for the next user. If not, then at operation 510, the activity data is aggregated into a single training data set. At operation 512, the single training data set is fed into a multi-task neural network learning algorithm, the multi-task neural network learning algorithm training a multi-task neural network by learning weights for each of a plurality of feature types for each of a plurality of different tasks, wherein each task is a different context of the plurality of different contexts. In an example embodiment, the learning comprises multiple binary classification problems where a context is associated with a cross entropy loss. Furthermore, in an example embodiment, the learning comprises combining context-specific losses using a simple sum or a weighted sum. The training may involve passing the training data set through one or more shared layers of multi-task neural network and then passing the output of the one or more shared layers to a different task-specific layer for each of the plurality of contexts. In some example embodiments, at each stage of the training, one context is randomly chosen, a loss is computed, using a loss function, for the randomly chosen context, and a gradient associated with the computed loss is backpropagated through earlier layers in the multi-task neural network. Additionally, in some example embodiments, for each of the plurality of contexts, output of a corresponding task-specific layer is passed to a different corresponding sigmoid layer.

Once the model has been trained, it can be utilized at evaluation time to generate a score. At operation 514, a plurality of feature values are obtained for a first user. At operation 516, the plurality of feature values and an input attribute are fed into the model to obtain a score. The score is indicative of the level of the first user in the input attribute for each of the different contexts.

Figure 6:
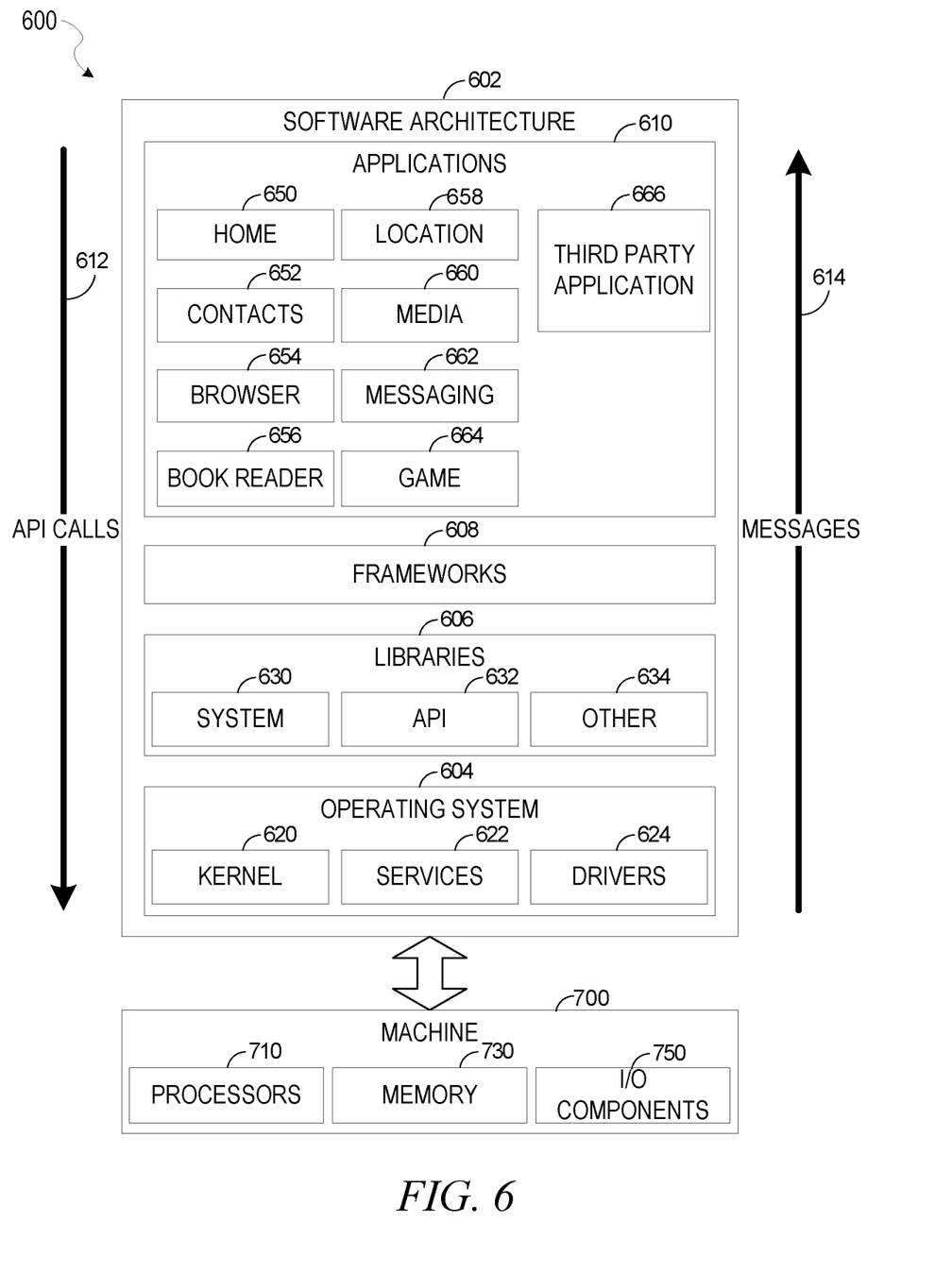
FIG. 6 is a block diagram illustrating a software architecture, in accordance with an example embodiment.

FIG. 6 is a block diagram 600 illustrating a software architecture 602, which can be installed on any one or more of the devices described above. FIG. 6 is merely a non-limiting example of a software architecture, and it will be appreciated that many other architectures can be implemented to facilitate the functionality described herein. In various embodiments, the software architecture 602 is implemented by hardware such as a machine 700 of FIG. 7 that includes processors 710, memory 730, and input/output (I/O) components 750. In this example architecture, the software architecture 602 can be conceptualized as a stack of layers where each layer may provide a particular functionality. For example, the software architecture 602 includes layers such as an operating system 604, libraries 606, frameworks 608, and applications 610. Operationally, the applications 610 invoke API calls 612 through the software stack and receive messages 614 in response to the API calls 612, consistent with some embodiments.

In various implementations, the operating system 604 manages hardware resources and provides common services. The operating system 604 includes, for example, a kernel 620, services 622, and drivers 624. The kernel 620 acts as an abstraction layer between the hardware and the other software layers, consistent with some embodiments. For example, the kernel 620 provides memory management, processor management (e.g., scheduling), component management, networking, and security settings, among other functionality. The services 622 can provide other common services for the other software layers. The drivers 624 are responsible for controlling or interfacing with the underlying hardware, according to some embodiments. For instance, the drivers 624 can include display drivers, camera drivers, BLUETOOTH® or BLUETOOTH® Low Energy drivers, flash memory drivers, serial communication drivers (e.g., Universal Serial Bus (USB) drivers), Wi-Fi® drivers, audio drivers, power management drivers, and so forth.

In some embodiments, the libraries 606 provide a low-level common infrastructure utilized by the applications 610. The libraries 606 can include system libraries 630 (e.g., C standard library) that can provide functions such as memory allocation functions, string manipulation functions, mathematic functions, and the like. In addition, the libraries 606 can include API libraries 632 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 606 can also include a wide variety of other libraries 634 to provide many other APIs to the applications 610.

The frameworks 608 provide a high-level common infrastructure that can be utilized by the applications 610, according to some embodiments. For example, the frameworks 608 provide various graphical user interface functions, high-level resource management, high-level location services, and so forth. The frameworks 608 can provide a broad spectrum of other APIs that can be utilized by the applications 610, some of which may be specific to a particular operating system 604 or platform.

In an example embodiment, the applications 610 include a home application 650, a contacts application 652, a browser application 654, a book reader application 656, a location application 658, a media application 660, a messaging application 662, a game application 664, and a broad assortment of other applications, such as a third-party application 666. According to some embodiments, the applications 610 are programs that execute functions defined in the programs. Various programming languages can be employed to create one or more of the applications 610, structured in a variety of manners, such as object-oriented programming languages (e.g., Objective-C, Java, or C++) or procedural programming languages (e.g., C or assembly language). In a specific example, the third-party application 666 (e.g., an application developed using the ANDROID™ or IOS™ software development kit (SDK) by an entity other than the vendor of the particular platform) may be mobile software running on a mobile operating system such as IOS™, ANDROID™, WINDOWS® Phone, or another mobile operating system. In this example, the third-party application 666 can invoke the API calls 612 provided by the operating system 604 to facilitate functionality described herein.

Figure 7:
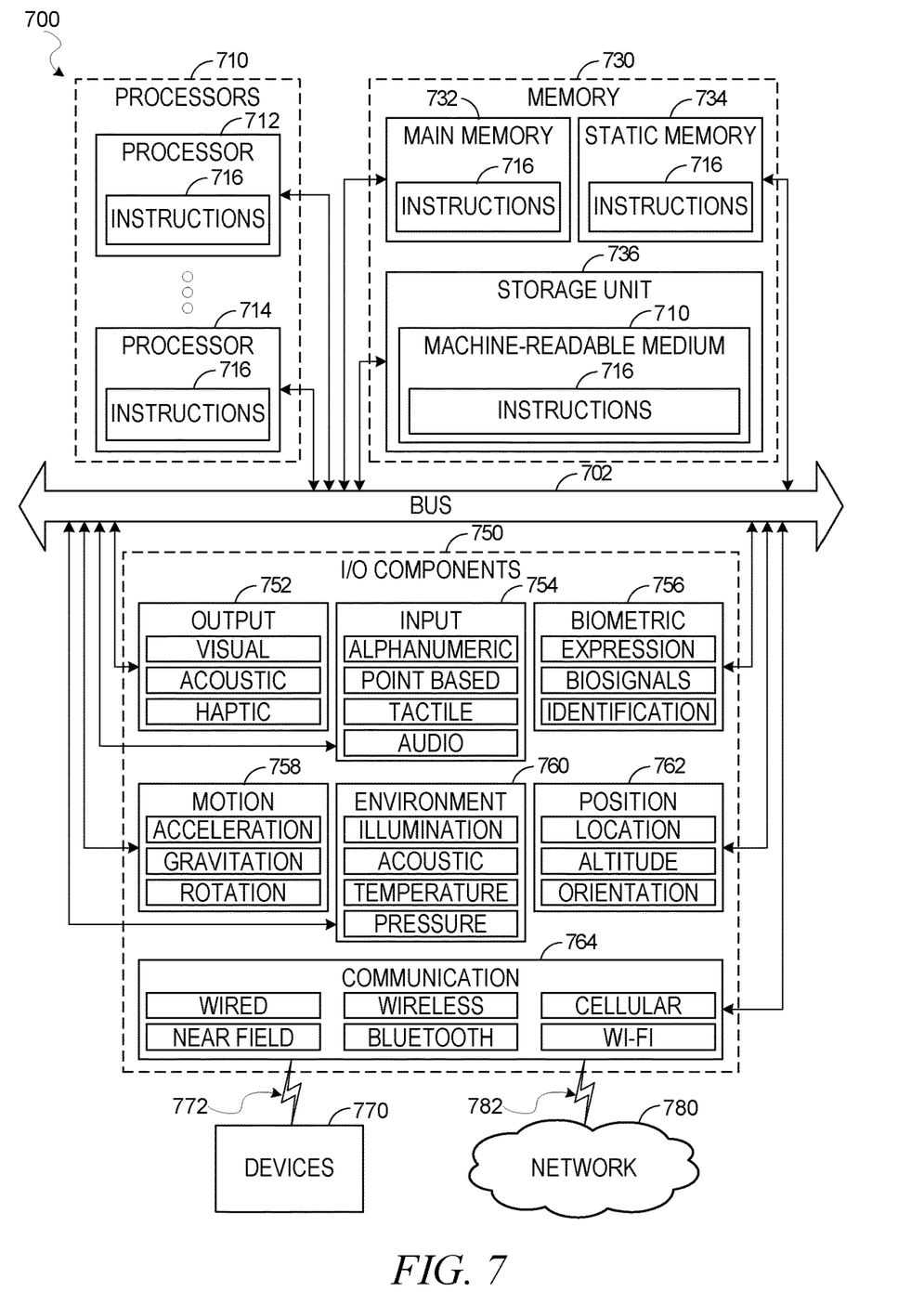
FIG. 7 illustrates a diagrammatic representation of a machine in the form of a computer system within which a set of instructions may be executed for causing the machine to perform any one or more of the methodologies discussed herein, according to an example embodiment.

FIG. 7 illustrates a diagrammatic representation of a machine 700 in the form of a computer system within which a set of instructions may be executed for causing the machine 700 to perform any one or more of the methodologies discussed herein, according to an example embodiment. Specifically, FIG. 7 shows a diagrammatic representation of the machine 700 in the example form of a computer system, within which instructions 716 (e.g., software, a program, an application 610, an applet, an app, or other executable code) for causing the machine 700 to perform any one or more of the methodologies discussed herein may be executed. For example, the instructions 716 may cause the machine 700 to execute the method 500 of FIG. 5. Additionally, or alternatively, the instructions 716 may implement FIGS. 1-5, and so forth. The instructions 716 transform the general, non-programmed machine 700 into a particular machine 700 programmed to carry out the described and illustrated functions in the manner described. In alternative embodiments, the machine 700 operates as a standalone device or may be coupled (e.g., networked) to other machines. In a networked deployment, the machine 700 may operate in the capacity of a server machine or a client machine in a server-client network environment, or as a peer machine in a peer-to-peer (or distributed) network environment. The machine 700 may comprise, but not be limited to, a server computer, a client computer, a PC, a tablet computer, a laptop computer, a netbook, a set-top box (STB), a portable digital assistant (PDA), an entertainment media system, a cellular telephone, a smartphone, a mobile device, a wearable device (e.g., a smart watch), a smart home device (e.g., a smart appliance), other smart devices, a web appliance, a network router, a network switch, a network bridge, or any machine capable of executing the instructions 716, sequentially or otherwise, that specify actions to be taken by the machine 700. Further, while only a single machine 700 is illustrated, the term "machine" shall also be taken to include a collection of machines 700 that individually or jointly execute the instructions 716 to perform any one or more of the methodologies discussed herein.

The machine 700 may include processors 710, memory 730, and I/O components 750, which may be configured to communicate with each other such as via a bus 702. In an example embodiment, the processors 710 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 712 and a processor 714 that may execute the instructions 716. The term "processor" is intended to include multi-core processors 710 that may comprise two or more independent processors 712 (sometimes referred to as "cores") that may execute instructions 716 contemporaneously. Although FIG. 7 shows multiple processors 710, the machine 700 may include a single processor 712 with a single core, a single processor 712 with multiple cores (e.g., a multi-core processor), multiple processors 710 with a single core, multiple processors 710 with multiple cores, or any combination thereof.

The memory 730 may include a main memory 732, a static memory 734, and a storage unit 736, all accessible to the processors 710 such as via the bus 702. The main memory 732, the static memory 734, and the storage unit 736 store the instructions 716 embodying any one or more of the methodologies or functions described herein. The instructions 716 may also reside, completely or partially, within the main memory 732, within the static memory 734, within the storage unit 736, within at least one of the processors 710 (e.g., within the processor's cache memory), or any suitable combination thereof, during execution thereof by the machine 700.

The I/O components 750 may include a wide variety of components to receive input, provide output, produce output, transmit information, exchange information, capture measurements, and so on. The specific I/O components 750 that are included in a particular machine 700 will depend on the type of machine 700. For example, portable machines such as mobile phones will likely include a touch input device or other such input mechanisms, while a headless server machine will likely not include such a touch input device. It will be appreciated that the I/O components 750 may include many other components that are not shown in FIG. 7. The I/O components 750 are grouped according to functionality merely for simplifying the following discussion, and the grouping is in no way limiting. In various example embodiments, the I/O components 750 may include output components 752 and input components 754. The output components 752 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 754 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 750 may include biometric components 756, motion components 758, environmental components 760, or position components 762, among a wide array of other components. For example, the biometric components 756 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 758 may include acceleration sensor components (e.g., accelerometer), gravitation sensor components, rotation sensor components (e.g., gyroscope), and so forth. The environmental components 760 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detect concentrations of hazardous gases for safety or to measure pollutants in the atmosphere), or other components that may provide indications, measurements, or signals corresponding to a surrounding physical environment. The position components 762 may include location sensor components (e.g., a Global Positioning System (GPS) receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 750 may include communication components 764 operable to couple the machine 700 to a network 780 or devices 770 via a coupling 782 and a coupling 772, respectively. For example, the communication components 764 may include a network interface component or another suitable device to interface with the network 780. In further examples, the communication components 764 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 770 may be another machine or any of a wide variety of peripheral devices (e.g., a peripheral device coupled via a USB).

Moreover, the communication components 764 may detect identifiers or include components operable to detect identifiers. For example, the communication components 764 may include radio frequency identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 764, such as location via Internet Protocol (IP) geolocation, location via Wi-Fi® signal triangulation, location via detecting an NFC beacon signal that may indicate a particular location, and so forth.

Executable Instructions and Machine Storage Medium

The various memories (i.e., 730, 732, 734, and/or memory of the processor(s) 710) and/or the storage unit 736 may store one or more sets of instructions 716 and data structures (e.g., software) embodying or utilized by any one or more of the methodologies or functions described herein. These instructions (e.g., the instructions 716), when executed by the processor(s) 710, cause various operations to implement the disclosed embodiments.

As used herein, the terms "machine-storage medium," "device-storage medium," and "computer-storage medium" mean the same thing and may be used interchangeably. The terms refer to a single or multiple storage devices and/or media (e.g., a centralized or distributed database, and/or associated caches and servers) that store executable instructions 716 and/or data. The terms shall accordingly be taken to include, but not be limited to, solid-state memories, and optical and magnetic media, including memory internal or external to the processors 710. Specific examples of machine-storage media, computer-storage media, and/or device-storage media include non-volatile memory including, by way of example, semiconductor memory devices, e.g., erasable programmable read-only memory (EPROM), electrically erasable programmable read-only memory (EEPROM), field-programmable gate array (FPGA), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Transmission Medium

In various example embodiments, one or more portions of the network 780 may be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 780 or a portion of the network 780 may include a wireless or cellular network, and the coupling 782 may be a Code Division Multiple Access (CDMA) connection, a Global System for Mobile communications (GSM) connection, or another type of cellular or wireless coupling. In this example, the coupling 782 may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long-Term Evolution (LTE) standard, others defined by various standard-setting organizations, other long-range protocols, or other data-transfer technology.

The instructions 716 may be transmitted or received over the network 780 using a transmission medium via a network interface device (e.g., a network interface component included in the communication components 764) and utilizing any one of a number of well-known transfer protocols (e.g., HTTP). Similarly, the instructions 716 may be transmitted or received using a transmission medium via the coupling 772 (e.g., a peer-to-peer coupling) to the devices 770. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 716 for execution by the machine 700, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

What is claimed is:

1. A system comprising:
   a non-transitory computer-readable medium having instructions stored thereon, which, when executed by a processor, cause the system to perform operations comprising:
   obtaining, via a plurality of different contexts of an online network, activity data indicative of a level in each of a plurality of attributes of each of a plurality of users, wherein each context is a different area of a graphical user interface in which users interact with the online network;
   aggregating the activity data into a training data set;
   feeding the training data set into a multi-task neural network learning algorithm, the multi-task neural network learning algorithm training a multi-task neural network by learning weights for each of a plurality of feature types for each of a plurality of different tasks, wherein each task is a different context of the plurality of different contexts;
   obtaining a plurality of feature values, of the plurality of feature types, for a first user; and feeding the plurality of feature values and an input attribute to the multi-task neural network to obtain a score, indicative of a level of the first user in the input attribute for each of the plurality of different contexts.

2. The system of claim 1, wherein the operations further comprise, in response to the feeding the plurality of feature values and an input attribute to the multi-task neural network to obtain a score, multiplying the weights learned for each of the plurality of feature types for a first task to the plurality of feature values for the first user, to compute a score for the first user for the input attribute in a context corresponding to the first task.

3. The system of claim 2, wherein the computing of the score for the first user further comprises summing products of the multiplying of each feature type and its corresponding feature value together.

4. The system of claim 1, wherein at least one of the contexts is one in which the plurality of feature values are input by the first user.

5. The system of claim 4, wherein at least one of the contexts is one in which at least one feature value is input by a user other than the first user.

6. The system of claim 1, wherein at least one of the contexts is one in which the plurality of features values is input by the user in response to a request by a user other than the first user.

7. The system of claim 1, wherein the learning the weights comprises passing the training data set through one or more shared layers of the multi-task neural network and then passing output of the one or more shared layers to a different task-specific layer for each of the plurality of different contexts.

8. The system of claim 7, wherein the learning the weights further comprises, at each of a plurality of training steps, randomly choosing one context, computing a loss, using a loss function, for the randomly chosen context, and backpropagating a gradient associated with the computed loss through earlier layers in the multi-task neural network.

9. The system of claim 8, wherein each layer of the multi-task neural network is normalized.

10. The system of claim 7, wherein the learning the weights further comprises, for each of the plurality of contexts, passing output of a corresponding task-specific layer to a different corresponding sigmoid layer.

11. A computerized method comprising:
obtaining, via a plurality of different contexts of an online network, activity data indicative of a level in each of a plurality of attributes of each of a plurality of users, wherein each context is a different area of a graphical user interface in which users interact with the online network;
aggregating the activity data into a training data set;
feeding the training data set into a multi-task neural network learning algorithm, the multi-task neural network learning algorithm training a multi-task neural network by learning weights for each of a plurality of feature types for each of a plurality of different tasks, wherein each task is a different context of the plurality of different contexts;
obtaining a plurality of feature values, of the plurality of feature types, for a first user; and
feeding the plurality of feature values and an input attribute to the multi-task neural network to obtain a score, indicative of a level of the first user in the input attribute for each of the plurality of different contexts.

12. The method of claim 11, further comprising, in response to the feeding the plurality of feature values and an input attribute to the multi-task neural network to obtain a score, multiplying the weights learned for each of the plurality of feature types for a first task to the plurality of feature values for the first user, to compute a score for the first user for the input attribute in a context corresponding to the first task.

13. The method of claim 12, wherein the computing of the score for the first user further comprises summing products of the multiplying of each feature type and its corresponding feature value together.

14. The method of claim 11, wherein at least one of the contexts is one in which the plurality of feature values are input by the first user.

15. The method of claim 14, wherein at least one of the contexts is one in which at least one feature value is input by a user other than the first user.

16. The method of claim 11, wherein at least one of the contexts is one in which the plurality of features values is input by the user in response to a request by a user other than the first user.

17. The method of claim 11, wherein the learning the weights comprises passing the training data set through one or more shared layers of the multi-task neural network and then passing output of the one or more shared layers to a different task-specific layer for each of the plurality of different contexts.

18. The method of claim 17, wherein the learning the weights further comprises, at each of a plurality of training steps, randomly choosing one context, computing a loss, using a loss function, for the randomly chosen context, and backpropagating a gradient associated with the computed loss through earlier layers in the multi-task neural network.

19. A non-transitory machine-readable storage medium comprising instructions which, when implemented by one or more machines, cause the one or more machines to perform operations comprising:
obtaining, via a plurality of different contexts of an online network, activity data indicative of a level in each of a plurality of attributes of each of a plurality of users, wherein each context is a different area of a graphical user interface in which users interact with the online network;
aggregating the activity data into a training data set;
feeding the training data set into a multi-task neural network learning algorithm, the multi-task neural network learning algorithm training a multi-task neural network by learning weights for each of a plurality of feature types for each of a plurality of different tasks, wherein each task is a different context of the plurality of different contexts;
obtaining a plurality of feature values, of the plurality of feature types, for a first user; and
feeding the plurality of feature values and an input attribute to the multi-task neural network to obtain a score, indicative of a level of the first user in the input attribute for each of the plurality of different contexts.

20. The non-transitory machine-readable storage medium of claim 19, wherein the operations further comprise, in response to the feeding the plurality of feature values and an input attribute to the multi-task neural network to obtain a score, multiplying the weights learned for each of the plurality of feature types for a first task to the plurality of feature values for the first user, to compute a score for the first user for the input attribute in a context corresponding to the first task.

* * * * *

UNITED STATES PATENT AND TRADEMARK OFFICE
CERTIFICATE OF CORRECTION

PATENT NO. : 11,604,990 B2
APPLICATION NO. : 16/902587
DATED : March 14, 2023
INVENTOR(S) : Yan et al.

It is certified that error appears in the above-identified patent and that said Letters Patent is hereby corrected as shown below:

In the Claims

In Column 19, Line 24, in Claim 6, delete "features" and insert --feature-- therefor In Column 20, Line 18 (Approx.), in Claim 16, delete "features" and insert --feature-- therefor Signed and Sealed this
Ninth Day of May, 2023

*Katherine Kelly Vidal*
Katherine Kelly Vidal
*Director of the United States Patent and Trademark Office*